United States Patent
Park et al.

(10) Patent No.: US 11,922,298 B2
(45) Date of Patent: Mar. 5, 2024

(54) NEURON DEVICE USING SPONTANEOUS POLARIZATION SWITCHING PRINCIPLE

(71) Applicant: SAMSUNG ELECTRONICS CO., LTD., Suwon-si (KR)

(72) Inventors: Jinhong Park, Suwon-si (KR); Sungjun Kim, Suwon-si (KR); Keun Heo, Suwon-si (KR); Hyeongjun Kim, Suwon-si (KR); Seyong Oh, Suwon-si (KR)

(73) Assignees: SAMSUNG ELECTRONICS CO., LTD., Suwon-si (KR); RESEARCH & BUSINESS FOUNDATION SUNKYUNKWAN UNIVERSITY, Suwon-si (KR)

( * ) Notice: Subject to any disclaimer, the term of this patent is extended or adjusted under 35 U.S.C. 154(b) by 983 days.

(21) Appl. No.: 16/858,823

(22) Filed: Apr. 27, 2020

(65) Prior Publication Data
US 2020/0342300 A1    Oct. 29, 2020

(30) Foreign Application Priority Data
Apr. 26, 2019  (KR) .................. 10-2019-0049383

(51) Int. Cl.
   *G06N 3/065*  (2023.01)
   *G11C 11/54*  (2006.01)

(52) U.S. Cl.
   CPC ............. *G06N 3/065* (2023.01); *G11C 11/54* (2013.01)

(58) Field of Classification Search
   CPC .. G06N 3/065; G06N 3/049; G06N 3/02–105; G11C 11/54; H03F 11/00;
   (Continued)

(56) References Cited

U.S. PATENT DOCUMENTS

| 9,087,609 B2 | 7/2015 | Lee et al. |
| 9,165,242 B2 | 10/2015 | Park et al. |
| 2020/0058339 A1 | 2/2020 | Hong et al. |

FOREIGN PATENT DOCUMENTS

| KR | 10-2014-0032186 | 3/2014 |
| KR | 10-1429160 | 8/2014 |

(Continued)

OTHER PUBLICATIONS

Heo, Jinseong et al. "Graphene and Thin-Film Semiconductor Heterojunction Transistors Integrated on Wafer Scale for Low-Power Electronics." Nano letters 13.12 (2013): 5967-5971. Web. (Year: 2013).*

(Continued)

*Primary Examiner* — Steven M Christopher
*Assistant Examiner* — Tyler J Wiegand
(74) *Attorney, Agent, or Firm* — F. CHAU & ASSOCIATES, LLC

(57) ABSTRACT

A neuron device is described. The neuron device is based on spontaneous polarization switching which includes a plurality of gate electrodes, a plurality of drain electrodes, a plurality of source lines, a dielectric layer, and a semiconductor layer. The gate electrodes are arranged parallel to each other. The drain electrodes are arranged parallel to each other. The source lines are arranged between the gate electrodes and the drain electrodes and parallel to each other. The dielectric layer is formed at intersections between the gate electrodes and the source lines. The semiconductor layer is formed at intersections between the drain electrodes and the source electrodes. The drain electrodes function as synapse-after-neuron linking terminals. The gate electrodes adjust an arrangement direction of electrical dipoles of the dielectric layer to control a firing time point and a firing height of the neuron device.

6 Claims, 8 Drawing Sheets

(58) Field of Classification Search
CPC .............. H01L 29/786; H01L 27/092; H01L 21/823425; H10B 63/80–845; H10N 70/253; H10N 70/826
See application file for complete search history.

(56) References Cited

FOREIGN PATENT DOCUMENTS

| KR | 10-2018-0045328 | | 5/2018 |
|----|-----------------|---|--------|
| KR | 10-2020-0026626 | | 3/2020 |
| WO | WO-2023018177 A1 | * | 2/2023 |

OTHER PUBLICATIONS

Siddiqui, Ghayas Uddin, Muhammad Muqeet Rehman, and Kyung Hyun Choi. "Enhanced Resistive Switching in All-Printed, Hybrid and Flexible Memory Device Based on Perovskite ZnSnO3 via PVOH Polymer." Polymer (Guilford) 100 (2016): 102-110. Web. (Year: 2016).*

Kim, Jong Su et al. "An Organic Vertical Field-Effect Transistor with Underside-Doped Graphene Electrodes." Advanced materials (Weinheim) 28.24 (2016): 4803-4810. Web. (Year: 2016).*

Liu, Jinyu et al. "Organic-Single-Crystal Vertical Field-Effect Transistors and Phototransistors." Advanced materials (Weinheim) 30.44 (2018): e1803655-n/a. Web (Year: 2018).*

Liu, Zhengdong et al. "Large-Area Patterned 2D Conjugated Microporous Polymers via Photomask-Assisted Solid-State Photopolymerization." Journal of materials chemistry. C, Materials for optical and electronic devices 6.27 (2018): 7295-7301. Web. (Year: 2018).*

Shih, Chih-Jen et al. "Partially-Screened Field Effect and Selective Carrier Injection at Organic Semiconductor/Graphene Heterointerface." Nano letters 15.11 (2015): 7587-7595. Web. (Year: 2015).*

Heo, Sunwoo et al. "Ternary Full Adder Using Multi-Threshold Voltage Graphene Barristors." IEEE electron device letters 39.12 (2018): 1948-1951. Web. (Year: 2018).*

Hlaing, Htay et al. "Low-Voltage Organic Electronics Based on a Gate-Tunable Injection Barrier in Vertical Graphene-Organic Semiconductor Heterostructures." Nano letters 15.1 (2015): 69-74. Web. (Year: 2015).*

* cited by examiner

NEURON DEVICE USING SPONTANEOUS POLARIZATION SWITCHING PRINCIPLE

CROSS-REFERENCE TO RELATED APPLICATION

This application claims the benefit of Korean Patent Application No. 10-2019-0049383, filed on Apr. 26, 2019, in the Korean Intellectual Property Office, the disclosure of which is incorporated by reference herein in its entirety.

BACKGROUND

The inventive concept relates to a transistor-based low-power neuron device using spontaneous polarization switching.

A neural network is a biological circuit consisting of a set of interconnected neurons used to collect and classify information. Neurons transfer electrical signals to other neurons, resulting in a certain level of cognition. Artificial neural networks (ANNs) replicate aspects of biological neural networks for machine learning and artificial intelligence (AI) applications.

A neuromorphic computing network is an example of an ANN that includes artificial neurons for transmitting a signal and synapses for linking these neurons to each other. Data generated using AI deep learning can be implemented in hardware-based neuromorphic computing. In some cases, the power use of a neuromorphic computing method may be low compared to alternative forms of ANN.

A neuron of a neuromorphic computing method transmits a signal (i.e., fires) and an action potential (i.e., a spike) is generated. The firing of a neuron may happen when the voltage value of a capacitor reaches a threshold value. However, firing may be delayed due to charging and discharging of the capacitor, which can reduce the response speed. Therefore, there is a need in the art to reduce the delay of firing of a neuron in a neuromorphic computing method.

SUMMARY

The inventive concept provides a transistor-based neuron device using a spontaneous polarization switching principle used to implement a low-power neuron semiconductor device, the transistor-based neuron device being capable of improving a response speed and reducing power consumption by operating based on adjusting a firing time point and a firing height through process control of a dielectric material and control of an input voltage pulse, and a method of manufacturing the transistor-based neuron device.

According to an aspect of the inventive concept, there is provided a neuron device using spontaneous polarization switching, the neuron device including a plurality of gate electrodes extending parallel to each other in a first direction; a plurality of drain electrodes extending parallel to each other in the first direction; a plurality of source lines arranged between the gate electrodes and the drain electrodes and extending parallel to each other in a direction intersecting the first direction; a dielectric layer formed at intersections between the gate electrodes and the source lines; and a semiconductor layer formed at intersections between the drain electrodes and the source lines, wherein the drain electrodes are configured to function as synapse-after-neuron linking terminals, and the gate electrodes are configured to adjust an arrangement direction of electrical dipoles of the dielectric layer to control a firing time point and a firing height of the neuron device.

According to another aspect of the inventive concept, there is provided a method of manufacturing a neuron device using spontaneous polarization switching, the method including forming a plurality of gate electrodes extending parallel to each other in a first direction on a substrate; forming a dielectric layer on the gate electrodes; forming a plurality of source lines extending parallel to each other in a direction intersecting the first direction on the dielectric layer; forming a semiconductor layer on the source lines; and forming a plurality of drain electrodes extending parallel to each other in the first direction on the semiconductor layer, wherein the drain electrodes function as synapse-after-neuron linking terminals, and the gate electrodes adjust an arrangement direction of electrical dipoles of the dielectric layer to control a firing time point and a firing height of the neuron device.

According to another aspect of the inventive concept, there is provided a method of manufacturing a neuron device using spontaneous polarization switching, the method including forming a plurality of drain electrodes extending parallel to each other in a first direction on a substrate; forming a semiconductor layer on the drain electrodes; forming a plurality of source lines extending parallel to each other in a direction intersecting the first direction on the semiconductor layer; forming a dielectric layer on the source lines; and forming a plurality of gate electrodes extending parallel to each other in the first direction on the dielectric layer, wherein the drain electrodes function as synapse-after-neuron linking terminals, and the gate electrodes adjust an arrangement direction of electrical dipoles of the dielectric layer to control a firing time point and a firing height of the neuron device.

According to another aspect of the inventive concept, a method of operating an artificial neural network (ANN) comprising a neuron device is described. The method may include applying an input signal to a gate electrode from a plurality of gate electrodes of the ANN to adjust an arrangement direction of electrical dipoles of a dielectric layer, wherein the arrangement direction of the electrical dipoles determines one or more control firing characteristics of the neuron device; firing the neuron device based at least in part on the input; and transmitting an output signal to one or more additional neuron devices of the ANN based on the firing, wherein the output signal is transmitted via a drain electrode from a plurality of drain electrodes of the ANN, wherein the gate electrodes and the drain electrodes extend parallel to each other in a first direction.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
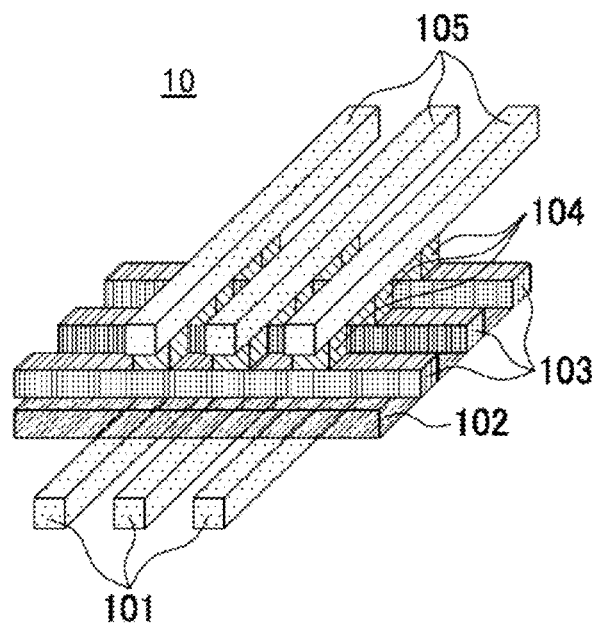
FIG. 1 is a perspective view of a neuron device using a spontaneous polarization switching principle, according to an embodiment of the inventive concept.

Embodiments of the present disclosure relate to a neuromorphic computing device. More specifically, certain embodiments relate to a transistor-based low-power neuron device using spontaneous polarization switching. For example, a neuron device may use a spontaneous polarization switching principle based on a plurality of gate electrodes, a plurality of drain electrodes, a plurality of source lines, a dielectric layer, and a semiconductor layer.

According to some embodiments, the plurality of gate electrodes may be arranged parallel to each other, and the plurality of drain electrodes may also be arranged parallel to each other. The plurality of source lines may be arranged between the gate electrodes and the plurality of drain electrodes and parallel to each other. The dielectric layer may be formed at intersections between the gate electrodes and the source lines. The semiconductor layer may be formed at intersections between the drain electrodes and the source electrodes. The drain electrodes may function as synapse-after-neuron linking terminals. The gate electrodes may adjust an arrangement direction of electrical dipoles of the dielectric layer to control a firing time point and a firing height of the neuron device.

Thus, a low power method of driving a neuron device may imitate an actual neural network structure. Integrate-and-fire, or leaky integrate-and-fire, methods may be used to determine whether to transmit a signal. For example, the determination may be made by comparing a voltage of a capacitor $V_{cap}$ based on a charge of the capacitor which is charged or discharged by a current signal received from a synapse. The synapse may have a certain threshold voltage $V_{th}$, and may use a CMOS comparator with a horizontal structure.

For example, an integrate-and-fire or leaky integrate-and-fire neuron model may operate via a comparison of the voltage value of a capacitor determined by a current received from a synapse with a threshold voltage. The neuron fires when the voltage value of the capacitor reaches the threshold value, and an action potential (spike) is generated. The firing speed may depend on the charging and discharging of the capacitor, and the overall response speed of the network is based on the firing speed.

Embodiments of the inventive concept will now be described more fully with reference to the accompanying drawings such that one of ordinary skill in the art to which the inventive concept pertains may execute the inventive concept. The inventive concept may, however, be embodied in many different forms and should not be construed as being limited to the embodiments set forth herein. In the drawings, parts irrelevant to the description are omitted for the simplicity of explanation, and like numbers refer to like elements throughout.

Throughout the specification, when an element is referred to as being "connected" or "coupled" to another element, the element can be directly connected or coupled to the other element, or can be electrically connected or coupled to the other element with intervening elements interposed therebetween. The terms "comprises" and/or "comprising" or "includes" and/or "including" when used in this specification, specify the presence of stated elements, but do not preclude the presence or addition of one or more other elements.

Figure 2:
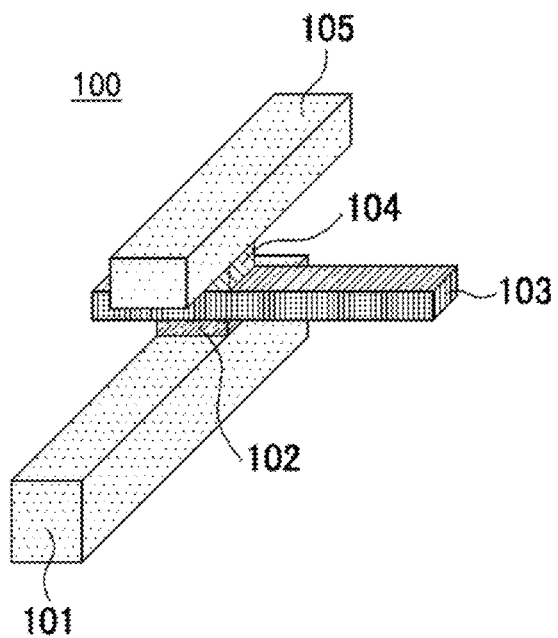
FIG. 2 is a perspective view illustrating a single neuron device part in a crossbar array structure according to an embodiment of the inventive concept.

FIG. 1 is a perspective view of a neuron device 10 using a spontaneous polarization switching principle with a crossbar array structure, according to an embodiment of the inventive concept. FIG. 2 is a perspective view illustrating a single cell 100 of the neuron device 10, according to an embodiment of the inventive concept.

Referring to FIGS. 1 and 2, the single cell 100 of the neuron device 100 uses a spontaneous polarization switching principle. The single cell 100 may include a plurality of gate electrodes 101, a plurality of source lines 103, and a plurality of drain electrodes 105. Each of the plurality of gate electrodes 101 may extend parallel to each other in a first direction. Each of the plurality of drain electrodes 105 each may extend parallel to each other in the first direction. Each of the plurality of source lines 103 may be arranged between the gate electrodes 101 and the drain electrodes 105.

Additionally, each of the plurality of source lines 103 may extend parallel to each other in a direction intersecting the first direction. A dielectric layer 102 may be arranged at intersections of the plurality of gate electrodes 101 and the plurality of source lines 103. A semiconductor layer 104 may be arranged at intersections of the plurality of source lines 103 and the plurality of drain electrodes 105. The plurality of drain electrodes 105 may function as synapse-after-neuron linking terminals. The plurality of gate electrodes 101 may adjust an arrangement direction of electrical dipoles of the dielectric layer 102. As a result a firing time point and a firing height of the neuron device 10 may be controlled.

Thus, a low-power neuron device 10 that overcomes a limit in the performance of conventional neuron devices may be provided when such a transistor-based neuron device 10 is implemented using a spontaneous polarization switching principle.

According to some embodiments, a method of operating an artificial neural network (ANN) may include applying an input signal to a gate electrode 101 from the plurality of gate electrodes 101 to adjust an arrangement direction of electrical dipoles of the dielectric layer 102, where the arrangement direction of the electrical dipoles determines one or more control firing characteristics (e.g., firing time or firing level) of the neuron device; firing the neuron device based at least in part on the input; and transmitting an output signal to one or more additional neuron devices of the ANN based on the firing, wherein the output signal is transmitted via a drain electrode 105 from the plurality of drain electrodes 105, wherein the gate electrodes 101 and the drain electrodes 105 extend parallel to each other.

In some cases, the ANN further comprises a plurality of source lines 103 extending parallel to each other (and perpendicular to the gate electrodes 101 and the drain electrodes 105) and a semiconductor layer 104 formed at intersections between the drain electrodes 105 and the source lines. 103 In some cases, the method further comprises determining that an output voltage is equal to or greater than a critical value; and applying a reset voltage to the gate electrode such that an arrangement direction of electrical dipoles of the dielectric layer 102 is switched to an opposite direction. In some cases, the method further comprises generating one or more constant input voltage pulses to produce the input signal.

Figure 3:
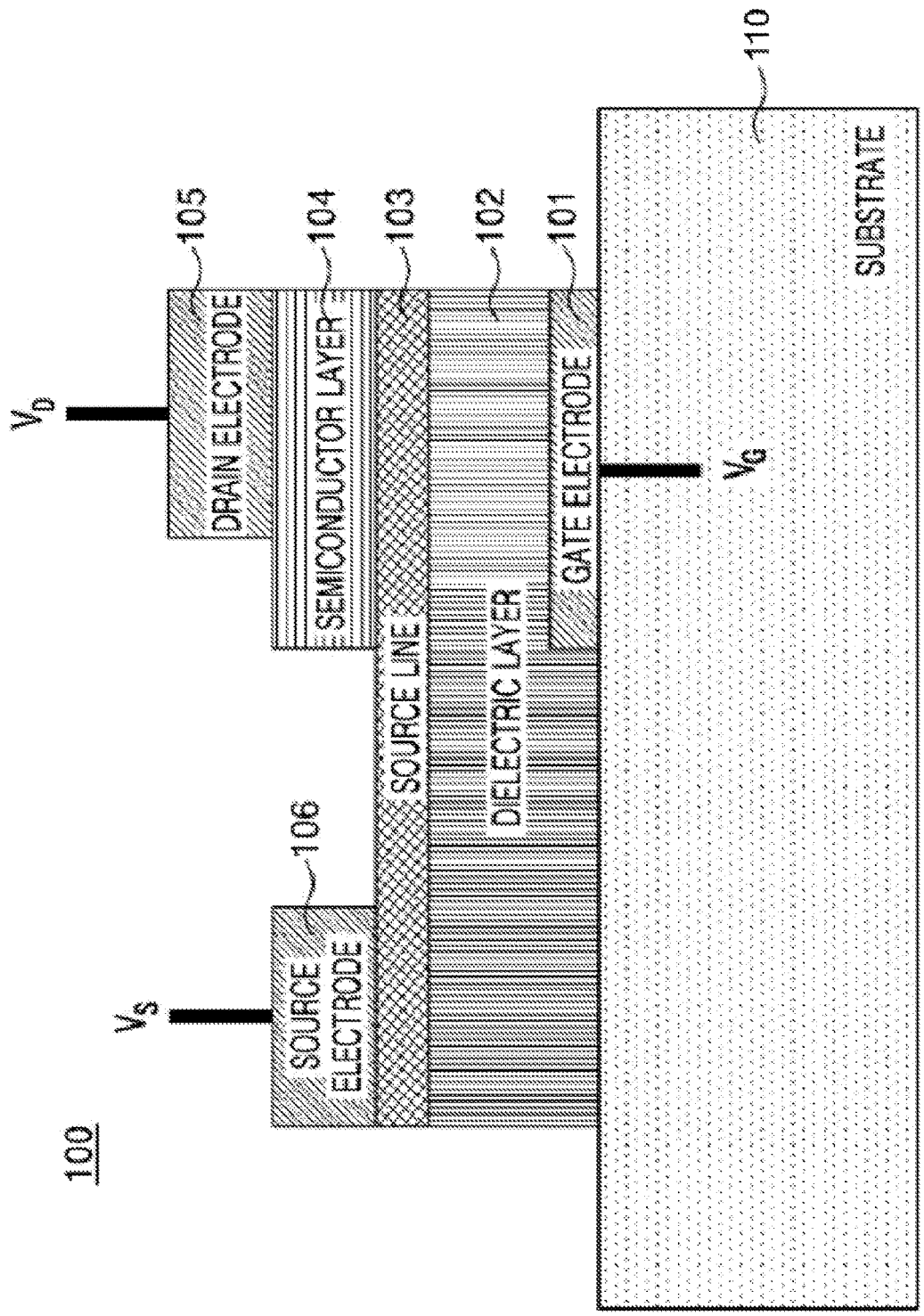
FIG. 3 is a cross-sectional view of a three-dimensional (3D) lower gate neuron device structure of the neuron device according to an embodiment of the inventive concept.

FIG. 3 is a cross-sectional view of a structure of a single cell 100 of the neuron device 10 (see, FIG. 1) including a gate electrode arranged in a lower portion of the neuron device according to some embodiment of the inventive concept.

Figure 4:
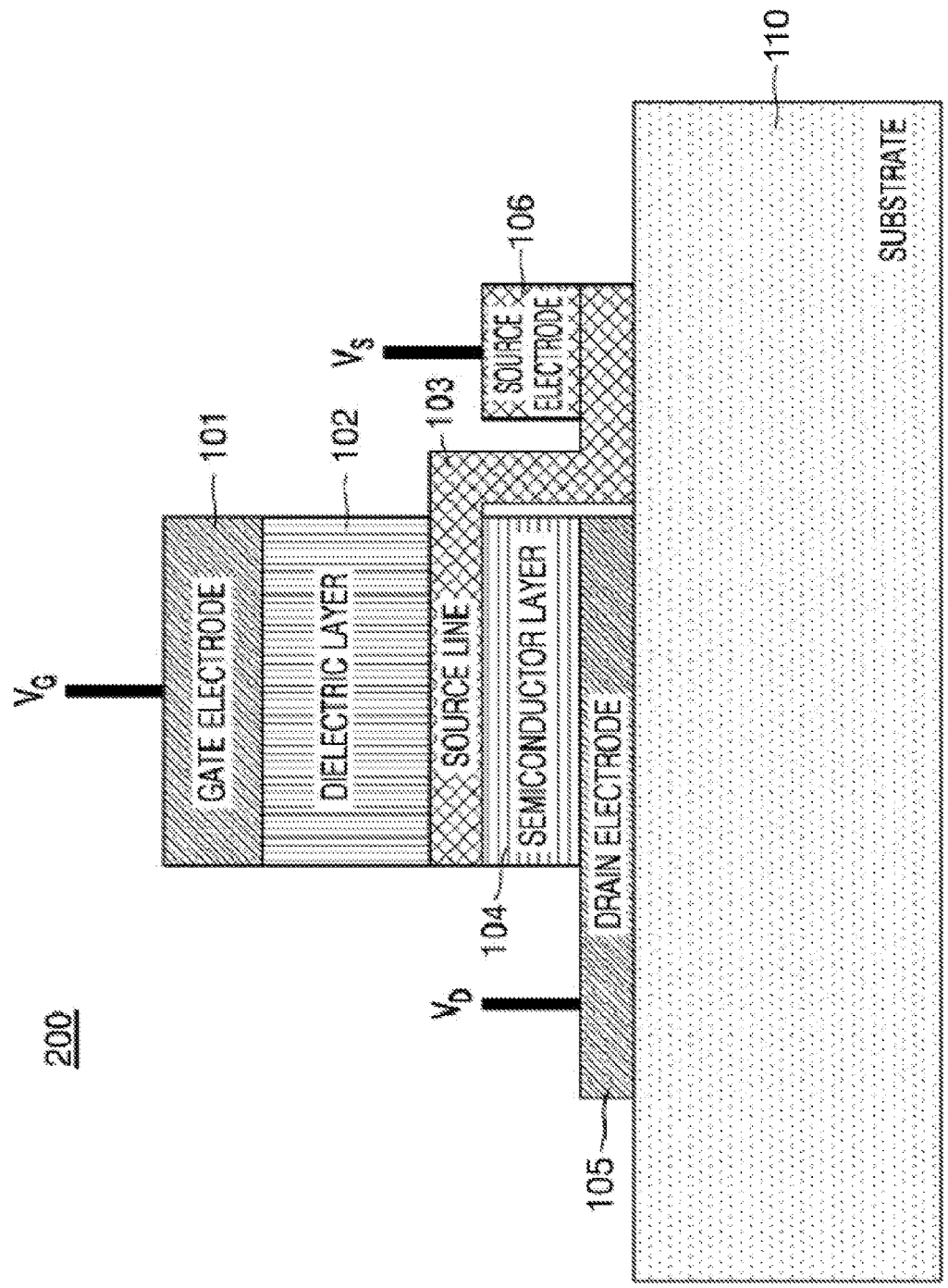
FIG. 4 is a cross-sectional view of a 3D upper gate neuron device structure of the neuron device according to an embodiment of the inventive concept.

FIG. 4 is a cross-sectional view of a structure of a single cell 200 of the neuron device 20 (see, FIG. 10) including a gate electrode arranged in an upper portion of the neuron device according to some embodiment of the inventive concept.

Referring to FIGS. 1 to 3, the neuron device further includes a controller (not shown) that compares an output voltage $V_D$ output by the drain electrode 105 according to an input voltage ($V_S$) signal applied to the source electrode 106 with a critical value. Additionally, the controller controls a voltage $V_G$ applied to the gate electrode 101.

When the output voltage $V_D$ is equal to or greater than the critical value, the controller may apply a reset voltage to the gate electrode 101 such that electric dipoles of the dielectric layer 102 may be switched to another direction. For example, the electric dipoles of the dielectric layer 102 may be switched to an opposite direction.

In detail, electric dipoles within the dielectric layer 102 may be gradually switched in a direction opposite to the direction of the initial state due to the voltage $V_G$ applied to the gate electrode 101. When a predetermined number of pulses or more are applied, the electric dipoles may be fully arranged.

The gate electrode 101 may be arranged in a lower portion of single cell 100 of the neuron device 10. Additionally, the drain electrode 105 may be arranged in an upper portion of the neuron device. The dielectric layer 102, the source line 103, and the semiconductor layer 104 may be sequentially stacked on the top surface of the gate electrode 101. A method of manufacturing the neuron device shown in FIG. 3 will be described later.

Figure 10:
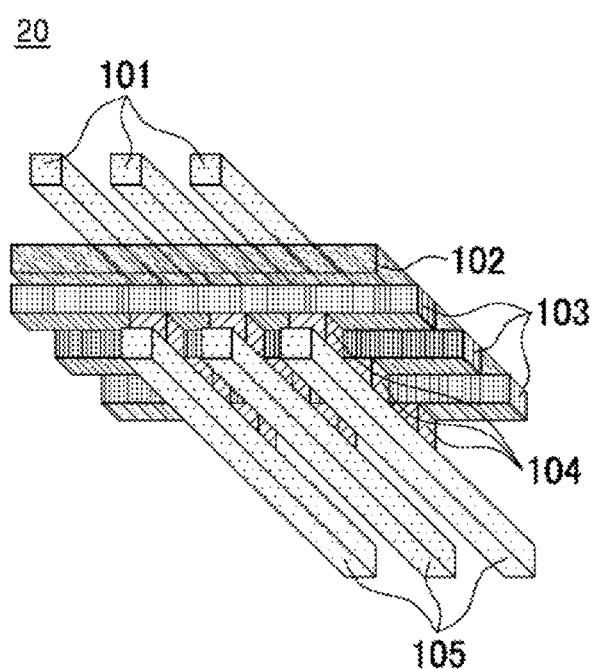
FIG. 10 is a perspective view of a neuron device using a spontaneous polarization switching principle, according to another embodiment of the inventive concept.

As another example, referring to FIGS. 4 and 10, the drain electrode 105 may be arranged in the lower portion of the neuron device, the gate electrode 101 may be arranged in the upper portion of the single cell 200 of the neuron device 20. The semiconductor layer 104, the source line 103, and the dielectric layer 102 may be sequentially stacked on the top surface of the drain electrode 105. A method of manufacturing the neuron device shown in FIG. 4 will be described later.

A substrate 110 may be formed of, for example, silicon (Si), germanium (Ge), glass, or a PET film. The dielectric layer 102 may be formed by growing, depositing, or directly transferring of the materials with spontaneous polarization characteristics such as a material with a perovskite structure (e.g., barium titanate ($BaTiO_3$) or lead titanium oxide ($PbTiO_3$)), a polymer material (e.g., polyvinylidene fluoride (PVDF)), and an oxide film (e.g., hafnium zirconium oxide ($HfZrO_2$), aluminum (Al) doped hafnium oxide ($HfO_2$), or silicon (Si) doped hafnium oxide ($HfO_2$)), and serves as an insulator of the gate electrodes 101.

The source line 103 may be formed of, for example, graphene or reduced graphene oxide capable of controlling the Fermi level through a gate voltage. The semiconductor layer 104 may include semiconductor materials such as Si, Ge, Group III-V semiconductors, an oxide semiconductor, an organic semiconductor, a transition metal dichalcogenide, and phosphorene.

Figure 5:
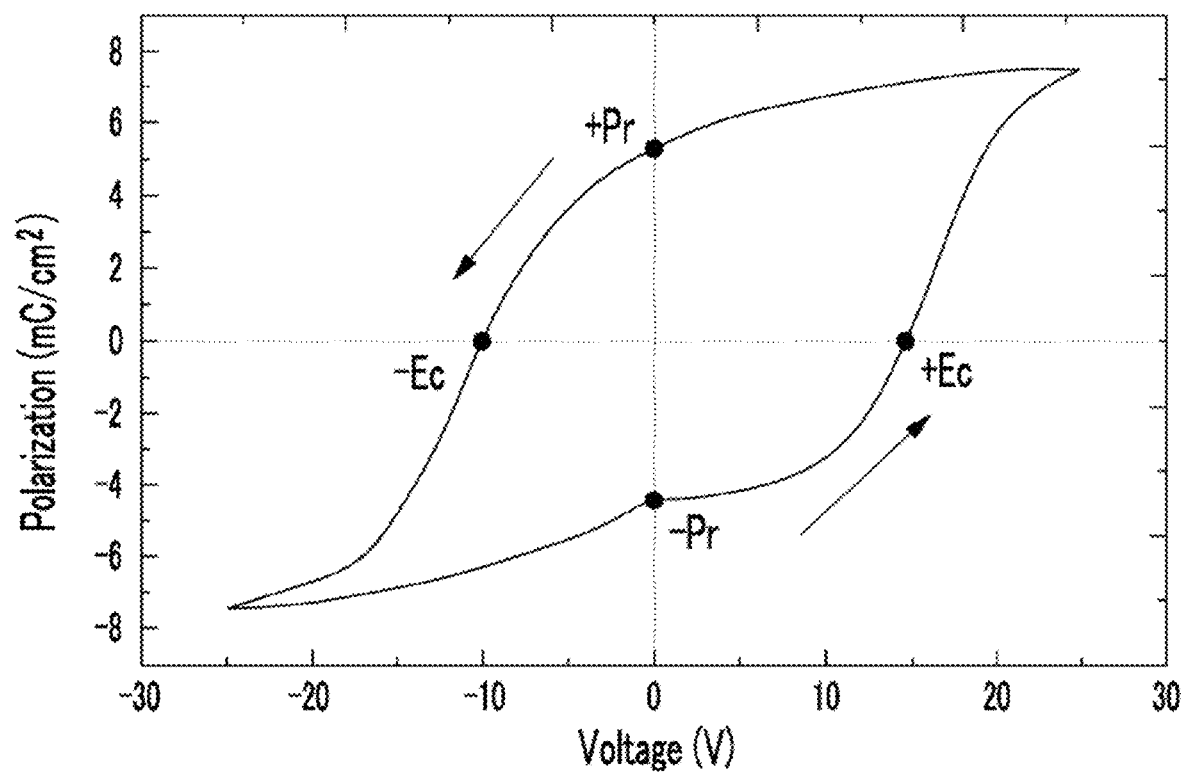
FIG. 5 is a graph showing polarization within a dielectric material according to an embodiment of the inventive concept.

FIG. 5 is a graph showing polarization within a dielectric material according to an embodiment of the inventive concept.

Referring to FIGS. 3 and 5, the Fermi level of the source line 103 changes due to a change of polarization of the dielectric layer 102 (see FIG. 3) along the hysteresis loop. The height of a potential barrier between the source line 103 and the semiconductor layer 104 may be changed due to the change of the Fermi level of the source line 103, thereby providing a current flowing from the source electrodes 103 to the semiconductor layer 104. When the electric dipoles are fully switched, a current going from drain to source may be formed. For example, the current that is formed may be high relative to a current, or lack of current, that exists when the electric dipoles are not fully switched. As a result, the point at which the electric dipoles are completely switched may be the point of ignition. By changing the amplitude, frequency, and width of the input voltage pulse, the time point at which the electric dipoles are fully switched may be adjusted. Accordingly, the firing time point of the single cell 100 may be controlled.

Figure 6:
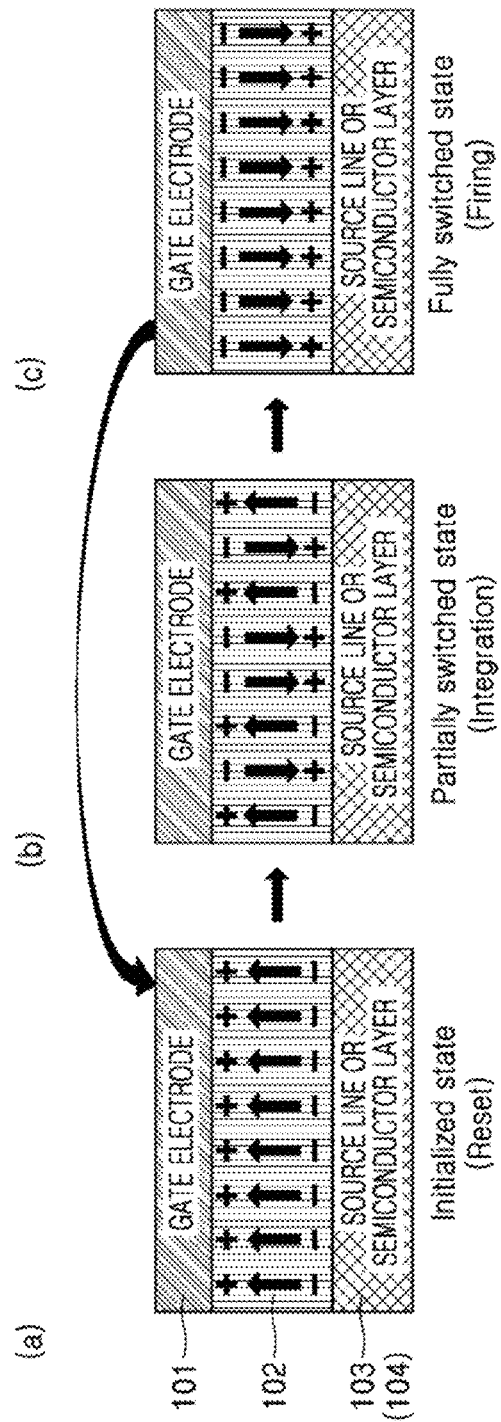
FIG. 6 is a view illustrating a variation in the polarization within a dielectric material according to an embodiment of the inventive concept.

FIG. 6 is a view illustrating a variation in the polarization within a dielectric material, according to an embodiment of the inventive concept.

Figure 7:
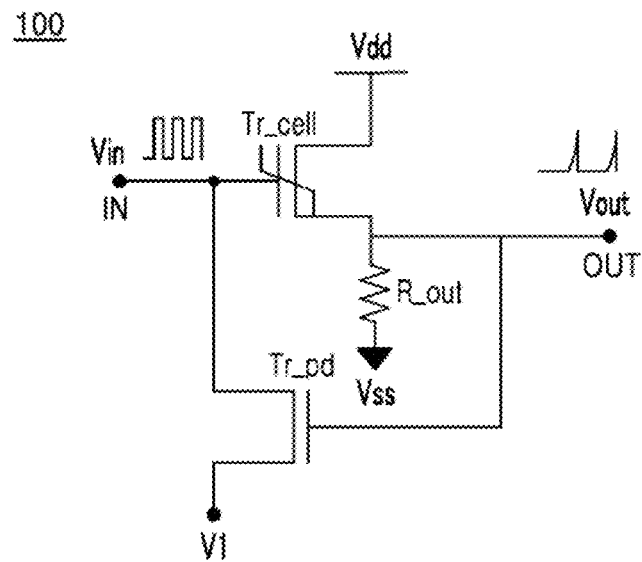
FIG. 7 is a circuit diagram of a conductance control neuron structure according to an embodiment of the inventive concept.

FIG. 7 is a circuit diagram of a conductance control neuron structure according to an embodiment of the inventive concept.

Figure 8:
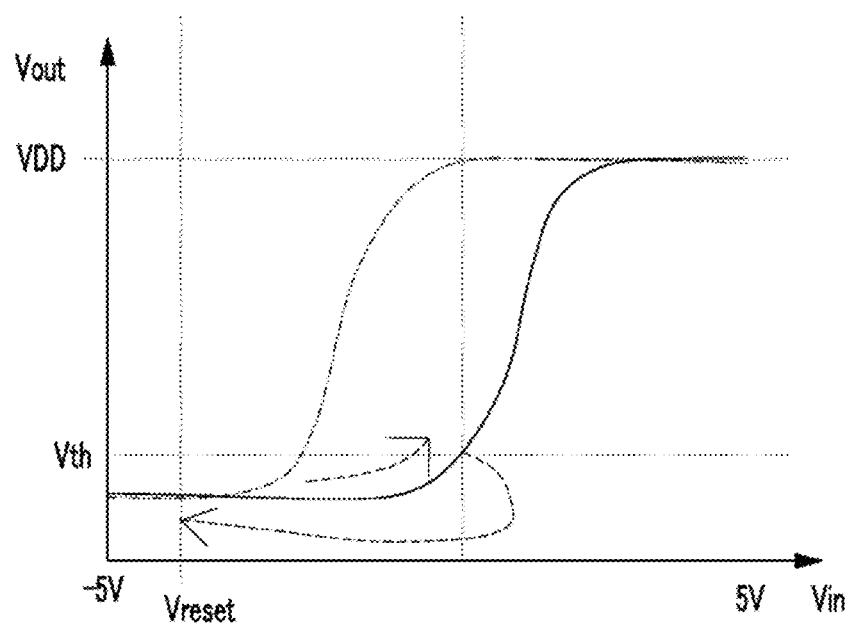
FIG. 8 is a hysteresis graph according to an embodiment of the inventive concept.

FIG. 8 is an electric polarization hysteresis graph according to an embodiment of the inventive concept.

Figure 9:
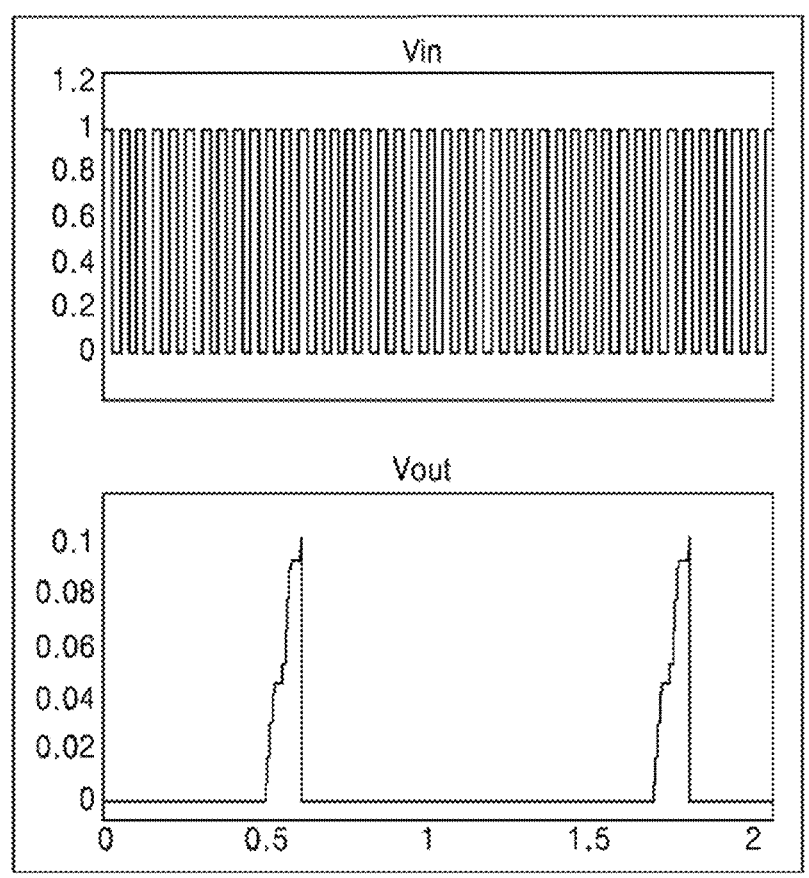
FIG. 9 is a view showing a result of a simulation using a conductance control device and a feedback circuit according to an embodiment of the inventive concept.

FIG. 9 is a view showing a result of a simulation using a conductance control device and a feedback circuit of FIG. 7, according to an embodiment of the inventive concept.

More specifically, FIG. 7 shows a circuit structure of a conductance control device-based neuron comparator, and FIG. 8 shows electric polarization hysteresis transfer characteristics of a conductance control device.

In detail, referring to FIG. 3, FIG. 7, FIG. 8, and FIG. 9, the single cell 10 may include a cell transistor Tr_cell, a pull-down transistor TR_pd, and an output resistor R_out. The cell transistor Tr_cell has variable conductance. The variable conductance may be dependent on the polarization of the dielectric layer 102. The controller may provide the input voltage Vin, which is a train of pulses with a constant voltage level, to a gate of the cell transistor Tr_cell via an input node IN. A supply voltage Vdd may be applied to the source of the cell transistor Tr_cell. The drain of the cell transistor Tr_cell may be connected to the output node OUT, such that the output voltage V_out is output through the drain of the cell. The output voltage V_out changes along the ramp curve. A first end of the output resistor R_out may be connected to the output node OUT. A ground voltage VSS may be provided to the second terminal of the output resistor R_out.

When the ramping output voltage is equal to or greater than the critical value, the controller may apply the reset voltage to the gate of the cell transistor Tr_cell. And the single cell 10 fires due to a relatively high current instantaneously generated by input of a train of voltage pulse with a constant voltage level. The firing time point and the firing height of the neuron device may be controlled through adjustment of an amplitude, a frequency, and a width of the input voltage pulse to be applied.

A gate of the pull-down transistor TR_pd is connected to the output node OUT. A first voltage V1 lower than the ground voltage VSS may be applied to the source of the pull-down transistor TR_pd. The drain of the pull-down transistor TR_pd may be connected to the gate of the cell transistor TR_cell to form a feedback loop. The reset voltage may be applied to the gate of the cell transistor TR_cell and the output voltage may be reset by the pull-down transistor TR_pd to reset after firing, when the ramping output voltage is equal to or greater than a particular voltage.

Referring to FIG. 8, the solid line curve shows the gain curve of output voltage to input voltage Vout/Vin in the initial state. A broken arrow pointing to the right means a change in firing process, and a broken arrow pointing to the left means a change in the reset process. As the number of pulses applied to the gate increases, the conductance of the channel changes. Therefore, the gain curve of Vout/Vin shifts to the left, as shown by the two-dotted-dashed line.

More specifically, as shown in FIG. 6, the '+' sign and the '−' sign respectively indicate the positive and negative poles of the electric dipole. The arrow indicates the direction of the electric dipole. In this case, as shown in (a) of FIG. 6, the alignment direction of the electric dipoles may be in the initial state (upward, for example). Then, as shown in (b) of FIG. 6, nucleation and growth of a ferroelectric domain within the dielectric layer 102 are induced in a direction in which conductance increases by consecutive pulses being applied through the gate electrode 101. Therefore, the dielectric layer 102 enters a partially switched state in which a portion of the electric dipoles in the dielectric layer 102 is aligned in the opposite direction from the initial state (downward, for example). Next, as shown in (c) of FIG. 6, when a minimum of a certain number of input pulses are applied to the gate electrode, the dielectric layer 102 may enter a fully switched state in which the dipoles are aligned in the opposite direction from the initial state. The neuron device may fire due to a current generated at the fully switched state (downward, for example).

Accordingly, as shown in FIG. 9, a result of a simulation using the conductance control device and the feedback circuit may be obtained, and firing (i.e. ramping of the output voltage Vout) and reset (i.e. return of output voltage Vout to zero voltage) periodically occur by the application of the input voltage Vin using a pulse train with a constant voltage level.

A method of manufacturing a neuron device using a spontaneous polarization switching principle, according to an embodiment of the inventive concept, will now be described. Components that perform the same function from among the components shown in FIGS. 1 through 9 will not be described herein.

FIG. 10 is a perspective view of a neuron device using a spontaneous polarization switching principle, according to another embodiment of the inventive concept.

Referring back to FIG. 1, a method of manufacturing the neuron device using the spontaneous polarization switching principle of FIG. 1 includes forming the plurality of gate electrodes 101, forming the dielectric layer 102, forming the plurality of source electrodes 103, forming semiconductor layer 104, and forming the plurality of drain electrodes 105.

The plurality of gate electrodes 101 may be formed via physical vapor deposition (e.g., thermal evaporation deposition, E-beam evaporation deposition, or sputtering deposition) such that the plurality of gate electrodes 101 are arranged on the substrate 110 and extend parallel to each other in the first direction. The dielectric layer 102 may be formed on the gate electrodes 101 via physical vapor deposition, spin coating deposition, or the like. The plurality of source electrodes 103 may be formed via deposition and transferring such that the plurality of source electrodes 103 may each extend parallel to each other in a direction intersecting the first direction and may be arranged on the dielectric layer 102. The semiconductor layer 104 may be formed on the source electrodes 103 via growth, deposition, and transferring. The plurality of drain electrodes 105 may be formed via physical deposition such that the drain electrodes 105 may intersect the source electrodes 103, each extend parallel to each other in the first direction, and be arranged on the semiconductor layer 104.

The drain electrodes 105 function as synapse-after-neuron linking terminals. The gate electrodes 101 adjust an arrangement direction of electrical dipoles of the dielectric layer 102 to control a firing time point and a firing height of the neuron device.

In detail, in the forming of the dielectric layer 102, the dielectric layer 102 may be formed of at least one of materials with spontaneous polarization characteristics such as a material with a perovskite structure (e.g., barium titanate ($BaTiO_3$) or lead titanium oxide ($PbTiO_3$)), a polymer material (e.g., polyvinylidene fluoride (PVDF)), and an oxide film (e.g., hafnium zirconium oxide ($HfZrO_2$), aluminum (Al):hafnium oxide ($HfO_2$), or silicon (Si):hafnium oxide ($HfO_2$)), and the dielectric layer 102 may be formed on the gate electrodes 101 at intersections between the gate electrodes 101 and the source electrodes 103 via physical vapor deposition or spin coating deposition. The size of a coercive field and a speed of switching of polarization may be controlled through adjustment of the thickness, the composition ratio, and the process temperature of the dielectric layer 102. Accordingly, the firing time point and the firing height of the neuron device may be controlled. In other words, the firing time point and the firing height of the neuron device may be controlled according to process control of a dielectric material.

Components that perform the same function from among the components of the above-described method will not be described herein.

Referring to FIG. 10, a method of manufacturing the neuron device using the spontaneous polarization switching principle of FIG. 10 includes forming the plurality of drain electrodes 105, forming semiconductor layer 104, forming the plurality of source electrodes 103, forming the dielectric layer 102, and forming the plurality of gate electrodes 101. The plurality of drain electrodes 105 may be formed such that the plurality of drain electrodes 105 are arranged on the substrate 110, and each extends parallel to each other in the first direction. The semiconductor layer 104 may be formed on the drain electrodes 105. The plurality of source electrodes 103 may be formed such that the plurality of source electrodes 103 extend in parallel to each other a direction intersecting the first direction and are arranged on the semiconductor layer 104. The dielectric layer 102 may be formed on the source electrodes 103. The plurality of gate electrodes 101 may be formed such that the gate electrodes 101 extend parallel to each other in the first direction and be arranged on the dielectric layer 102.

The drain electrodes 105 function as synapse-after-neuron linking terminals, and the gate electrodes 101 adjust an arrangement direction of electrical dipoles of the dielectric layer 102 to control a firing time point and a firing height of the neuron device.

While the inventive concept has been particularly shown and described with reference to exemplary embodiments thereof, it will be understood that various changes in form and details may be made therein without departing from the spirit and scope of the inventive concept. Thus, the above-described embodiments should be considered in descriptive sense only and not for purposes of limitation. For example, each component described as a single type may be implemented in a distributed manner, and similarly, components described as being distributed may be implemented in a combined form.

While the inventive concept has been particularly shown and described with reference to embodiments thereof, it will be understood that various changes in form and details may be made therein without departing from the spirit and scope of the following claims.

What is claimed is:

1. A neuron device comprising:
    a plurality of gate electrodes extending parallel to each other in a first direction and separated from each other in a second direction perpendicular to the first direction;
    a plurality of drain electrodes extending parallel to each other in the first direction and separated from each other in the second direction;
    a plurality of source lines arranged separate from and between the plurality of gate electrodes and the plurality of drain electrodes in a third direction perpendicular to the first direction and the second direction, extending parallel to each other in the second direction, and separated from each other in the first direction, wherein each of the plurality of source lines intersects each of the plurality of gate electrodes and each of the plurality of drain electrodes in a plan view from above the plurality of gate;
    a dielectric layer formed between the plurality of gate electrodes and the plurality of source lines in the third direction at a plurality of intersections between the plurality of gate electrodes and the plurality of source lines; and
    a semiconductor layer formed between the plurality of drain electrodes and the plurality of source lines in the third direction at a plurality of intersections between the plurality of drain electrodes and the plurality of source lines.

2. The neuron device of claim 1, wherein the gate electrodes are located in a lower portion of the neuron device,
    the drain electrodes are located in an upper portion of the neuron device, and
    the dielectric layer, the source lines, and the semiconductor layer are sequentially stacked on top surfaces of the gate electrodes.

3. The neuron device of claim 1, wherein the drain electrodes are located in a lower portion of the neuron device, and the gate electrodes are located in an upper portion of the neuron device, and
    the semiconductor layer, the source lines, and the dielectric layer are sequentially stacked on top surfaces of the drain electrodes.

4. The neuron device of claim 1, further comprising a controller configured to compare an output voltage output by the drain electrodes based on an input voltage signal applied to the source lines with a threshold value and control a voltage to be applied to the gate electrodes,
    wherein, when the output voltage is equal to or greater than the threshold value, the controller applies a reset voltage to the gate electrodes such that an arrangement direction of electrical dipoles of the dielectric layer is switched in an opposite direction.

5. The neuron device of claim 4, wherein the controller controls the firing time point and the firing height of the neuron device using a high current that is instantaneously generated by applying a constant input voltage pulse.

6. The neuron device of claim 1, wherein the dielectric layer comprises a perovskite structure, a polymer material, or an oxide film.

* * * * *